United States Patent
Kessler et al.

(10) Patent No.: US 10,910,571 B2
(45) Date of Patent: *Feb. 2, 2021

(54) ORGANIC ELECTRONIC COMPONENT AND USE OF A FLUORINATED SULFONIMIDE METAL SALT

(71) Applicant: OSRAM OLED GmbH, Regensburg (DE)

(72) Inventors: Florian Kessler, Höchstadt (DE); Andreas Rausch, Regensburg (DE); Anna Maltenberger, Leutenbach (DE); Dominik Pentlehner, Burghausen (DE); Niels Gerlitzki, Augsburg (DE); Günter Schmid, Hemhofen (DE); Sabine Szyszkowski, Dachsbach (DE); Dimitrios Zevgitis, Erlangen (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 15/774,243

(22) PCT Filed: Dec. 14, 2016

(86) PCT No.: PCT/EP2016/081033
§ 371 (c)(1),
(2) Date: May 7, 2018

(87) PCT Pub. No.: WO2017/102861
PCT Pub. Date: Jun. 22, 2017

(65) Prior Publication Data
US 2018/0331308 A1  Nov. 15, 2018

(30) Foreign Application Priority Data
Dec. 15, 2015 (DE) .......... 10 2015 121 844

(51) Int. Cl.
*H01L 51/00* (2006.01)
*H01L 51/54* (2006.01)
(Continued)

(52) U.S. Cl.
CPC ........ *H01L 51/0091* (2013.01); *H01L 51/002* (2013.01); *H01L 51/506* (2013.01);
(Continued)

(58) Field of Classification Search
None
See application file for complete search history.

(56) References Cited

U.S. PATENT DOCUMENTS 8,278,652 B2  10/2012  Krause et al.
9,263,696 B2   2/2016  Kellermann et al.
(Continued)

FOREIGN PATENT DOCUMENTS

DE  102007028237 A1  12/2008
DE  102007028236 A1   1/2009
(Continued)

OTHER PUBLICATIONS

Earle, M.J. et al., "Metal bis{(trifluoromethyl)sulfonyl} amide complexes: highly efficient Friedel-Crafts acylation catalysts," ChemComm Communication, 2004, 2 pages.
(Continued)

*Primary Examiner* — Katie L. Hammer
(74) *Attorney, Agent, or Firm* — Slater Matsil, LLP

(57) ABSTRACT

An organic electronic component is disclosed. In an embodiment an organic electronic component includes at least one organic layer having a fluorinated sulfonimide metal salt of the following formula:

(Continued)

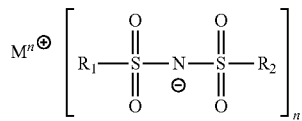

wherein M is either a divalent or higher-valent metal having an atomic mass of greater than 26 g/mol or a monovalent metal having an atomic mass of greater than or equal to 39 g/mol, where $1 \leq n \leq 7$, and wherein $R_1$, $R_2$ are selected independently of one another from the group consisting of a fluorine-substituted aryl radical, a fluorine-substituted alkyl radical and a fluorine-substituted arylalkyl radical.

20 Claims, 8 Drawing Sheets

(51) Int. Cl.
  *H01L 51/50* (2006.01)
  *H01L 51/05* (2006.01)
  *H01L 51/42* (2006.01)
(52) U.S. Cl.
  CPC ...... *H01L 51/5056* (2013.01); *H01L 51/0512* (2013.01); *H01L 51/4293* (2013.01); *Y02E 10/549* (2013.01)

(56) References Cited

U.S. PATENT DOCUMENTS

| | | | |
|---|---|---|---|
| 9,627,641 B2 | 4/2017 | Schmid et al. | |
| 9,797,567 B2 | 10/2017 | Kastner-Jung et al. | |
| 9,929,362 B2 | 3/2018 | Maltenberger et al. | |
| 2002/0040728 A1* | 4/2002 | Yoshikawa | H01G 9/2009 136/263 |
| 2008/0067924 A1* | 3/2008 | Prakash | H01L 51/0003 313/504 |
| 2011/0086176 A1 | 4/2011 | Yoon et al. | |
| 2011/0089408 A1 | 4/2011 | Schmid et al. | |
| 2012/0080086 A1* | 4/2012 | Yoon | H01L 31/02246 136/256 |
| 2012/0192945 A1 | 8/2012 | Kuhn et al. | |
| 2014/0116509 A1 | 5/2014 | Vail et al. | |
| 2015/0123047 A1 | 5/2015 | Maltenberger et al. | |
| 2017/0301872 A1 | 10/2017 | Schmid et al. | |

FOREIGN PATENT DOCUMENTS

| | | |
|---|---|---|
| DE | 102010041331 A1 | 3/2012 |
| DE | 102012209520 A1 | 12/2013 |
| DE | 102012209523 A1 | 12/2013 |
| DE | 102014114224 A1 | 3/2016 |
| DE | 102014114231 A1 | 3/2016 |
| EP | 2656412 A1 | 10/2013 |
| EP | 3133664 A1 | 2/2017 |
| JP | 2013039817 A | 2/2013 |
| WO | 2010066245 A1 | 6/2010 |
| WO | 2012104742 A1 | 8/2012 |
| WO | 2014191767 A1 | 12/2014 |

OTHER PUBLICATIONS

Kalyanasundaram, K., "Dye-Sensitized Solar Cells," CRC Press Taylor and Francis Group, 2010, 7 pages.
Koppel, I. et al., "The Acidity of Some Neutral NH-Acids in Water and Dimethyl Sulfoxide," J. Chem Research (S), vol. 6, 1994, 2 pages.
Pitula, S. et al., "Synthesis, Structure, and Physico-optical Properties of Manganate (II)-Based Ionic Liquids," Chemistry—A European Journal, vol. 16, No. 11, DOI: 10/1002chem/200802660, Full Paper, 2010, 11 pages.
Snaith, H.J. et al., "Enhanced Charge Mobility in a Molecular Hole Transporter via Addition of Redox Inactive Ionic Dopant: Implication to Dye-Sensitized Solar Cells," Applied Physics Letters, vol. 89, 262114, 2006, 4 pages.
Stricker, M. et al., "Copper(I) and Silver(I) Bis(trifluoromethanesulfonyl)imide and Their Interaction with an Arene, Diverse Olefins, and an NTf2-Based Ionic Liquid," Chemistry—A European Journal, ChemPubSoc Europe, DOI: 10.1002/chem.201201740, Full Paper, vol. 19, No. 3, 2013, 16 pages.

* cited by examiner

FIG 12

| Cu(TFSI)$_2$/R-D NHT-51 | L (cd/m$^2$) | Peff (lm/W) | Ieff (cd/A) | EQE (%) | U (V) | I (mA/cm$^2$) |
|---|---|---|---|---|---|---|
| 3% R-D | 1469 | 3.7 | 4.9 | 11.60 | 4.20 | 30 |
| 3% Cu(TFSI)$_2$ | 1495 | 3.8 | 5.0 | 11.80 | 4.13 | 30 |
| 5% Cu(TFSI)$_2$ | 1470 | 3.7 | 4.9 | 11.62 | 4.16 | 30 |
| 10% Cu(TFSI)$_2$ | 1628 | 4.0 | 5.4 | 12.77 | 4.26 | 30 |
| 15% Cu(TFSI)$_2$ | 1670 | 3.9 | 5.6 | 13.06 | 4.43 | 30 |

ORGANIC ELECTRONIC COMPONENT AND USE OF A FLUORINATED SULFONIMIDE METAL SALT

This patent application is a national phase filing under section 371 of PCT/EP2016/081033, filed Dec. 14, 2016, which claims the priority of German patent application 10 2015 121 844.5, filed Dec. 15, 2015, each of which is incorporated herein by reference in its entirety.

TECHNICAL FIELD

The invention relates to an organic electronic component. The invention further relates to the use of a fluorinated sulfonimide metal salt.

BACKGROUND

In organic electronic components, such as, for example, organic transistors, organic light-emitting diodes, organic light-emitting electrochemical cells, organic solar cells and organic photodetectors, so-called charge transporting layers are required in order to ensure a stable charge transport. In light-emitting diodes, the described layer can be used both as a transport layer and in a charge generation layer. In this case, both hole-transport layers and electron-transport layers are used. In order to increase the efficiency of the components, the matrix materials used in the charge-transporting layers are often additionally doped with further compounds, so-called dopants, which improve charge transport. Hole-transport layers are frequently mixed with metals, metal complexes or metal salts as so-called p-dopants. In particular in the case of organic light-emitting diodes, the luminescence, the efficiency and the service life are very strongly dependent on the exciton density (electrode hole pair density) in the light-emitting layer, so that an efficient electron and hole transport from the electrodes into the light-emitting layer is required. In particular in the case of large surface light guides, the hole transport layer is very important for the efficiency yield. The voltage drop across the transport layers should therefore be minimized in order to obtain a high efficiency of the organic electronic component. LiTFSI has hitherto been used in solar cells.

SUMMARY OF THE INVENTION

Embodiments provide an efficient organic electronic component. Further embodiments provide the use of a fluorinated sulfonimide metal salt as a p-dopant for increasing electrical conductivity.

In at least one embodiment, the organic electronic component comprises at least one organic layer. The organic layer comprises a fluorinated sulfonimide metal salt. The fluorinated sulfonimide metal salt is able to increase the electrical conductivity. The fluorinated sulfonimide metal salt has the following structural formula 1:

$$M^{n\oplus} \left[ R_1 - \underset{\underset{O}{\parallel}}{\overset{\overset{O}{\parallel}}{S}} - \underset{\ominus}{N} - \underset{\underset{O}{\parallel}}{\overset{\overset{O}{\parallel}}{S}} - R_2 \right]_n \quad (1)$$

M is either a divalent or higher-valent metal having an atomic mass of greater than 26 g/mol or a monovalent metal having an atomic mass of greater than or equal to 39 g/mol. In this case, n is the valence of M and the following applies: $1 \leq n \leq 7$. $R_1$ and $R_2$ can be selected independently of one another. $R_1$ and $R_2$ can be selected from the following group or combinations thereof: a fluorine-substituted aryl radical, a fluorine-substituted alkyl radical, a fluorine-substituted arylalkyl radical.

In other words, the organic layer comprises a fluorinated sulfonimide metal salt, i.e., a metal cation and one or more sulfonimide anions. The sulfonimide anion is simply negatively charged. The metal cation is positively charged n times and correspondingly requires n fluorinated sulfonimide anions in order to form a neutral metal salt. In particular, n has a value of 1 to 4 inclusive, particularly preferably 1 to 2 inclusive. Higher-valent metal cations can in particular have a better doping effect, because the lewis-acid character is more pronounced. In particular, oxidizing cations, such as $Fe^{3+}$, are rather undesirable.

According to at least one embodiment, M is selected from a group comprising: copper, zinc, aluminum, bismuth, potassium, rubidium, caesium and tin. Alternatively or additionally, the radicals $R_1$ and/or $R_2$ can each be a trifluoromethane. This allows fluorinated sulfonimide metal salts, i.e., in particular, trifluoromethanesulfonimide metal salts (TFSI), such as $Sn(TFSI)_4$, $Zn(TFSI)_2$, $Cu(TFSI)_2$ and $K(TFSI)$. These metal salts are commercially available and are particularly easily accessible. The inventors have recognized that by means of these commercially available metal salts, the electrical properties of organic matrix materials, in particular organic hole conductors, can be improved if the matrix materials are doped with the metal salts.

Preferably, M=copper. In addition, n=2.

The fluorinated sulfonimide metal salts according to embodiments of the invention do not belong to the superacids, since the sulfonimide metal salts have an acid constant value PkS>0. Superacids have in particular a PkS value of <0. A decisive advantage compared to superacids is that the fluorinated sulfonimide metal salts can be vaporized without decomposition and can thus be provided by sublimation in the required high purity and can be used in the vacuum process.

According to at least one embodiment, the radicals $R_1$ and $R_2$ are selected independently of one another and from the following group: a linear or branched, at least partially fluorine-substituted alkyl radical having 1 to 10 carbon atoms, an at least partially fluorine-substituted aryl radical having 1 to 20 carbon atoms or an at least partially fluorine-substituted arylalkyl radical having 1 to 20 carbon atoms. Alternatively, the alkyl radicals, aryl radicals and arylalkyl radicals described above may also be completely substituted by fluorine.

According to at least one embodiment, $R_1$ and $R_2$ are selected from the same substituents and from the following group:

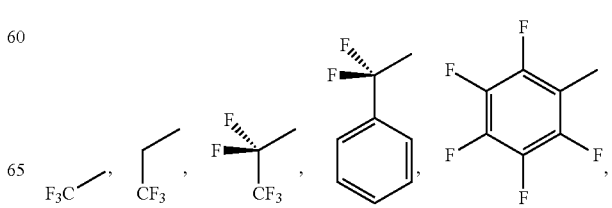

-continued

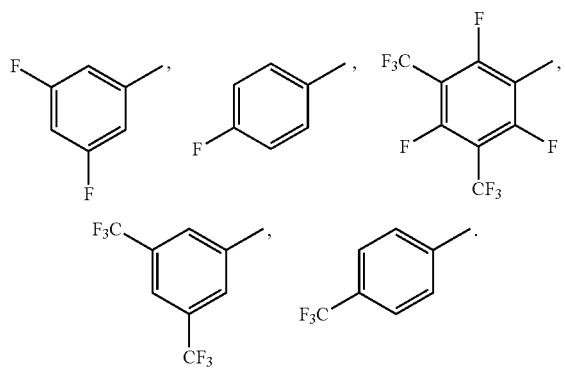

According to at least one embodiment, the sulfonimide anion is selected from the following group:

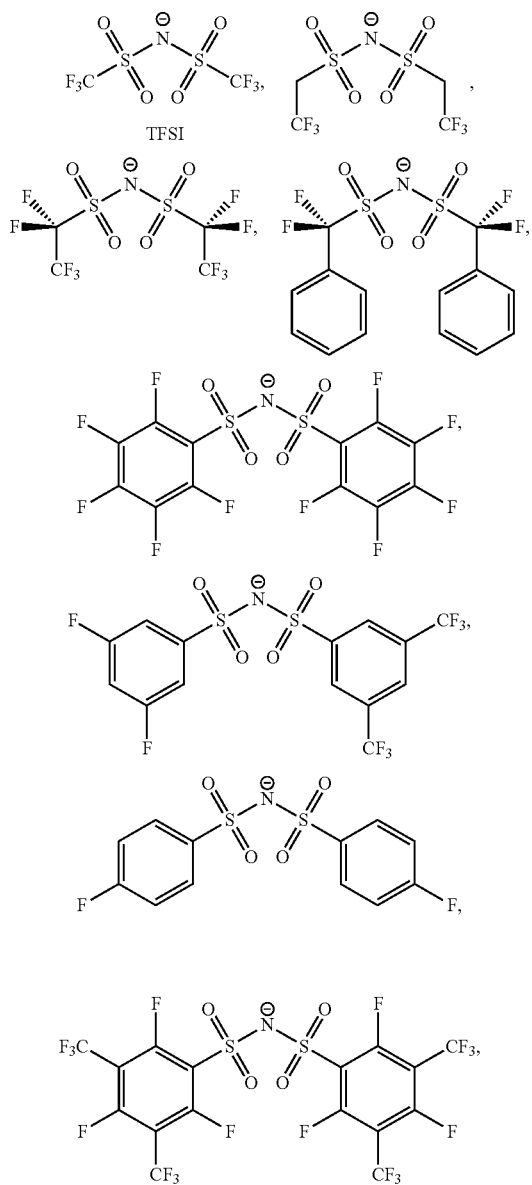

In this case, the formulae, which are just illustrated for the sulfonimide anion, are to be regarded as exemplary only and serve for illustration purposes. These sulfonimide anions are not intended to limit the scope of the invention. Within the scope of the invention, several identical or different fluorinated sulfonimide anions can be bound to a metal centre Mn+. The coordination of individual sulfonimide anions can also be different. For example, an anion can only be bound to the metal simply by means of oxygen. Alternatively, the connection can also be carried out twice via different oxygen atoms. The connection via a nitrogen or sulphur of the fluorinated sulfonimide anion is also conceivable. The metal salt can form an ionic bond and/or a complex compound. For example, the sulfonimide anion can be coordinated via two oxygen atoms to the metal. This can also be referred to as chelating.

According to at least one embodiment, M is selected from the group of divalent or higher-valent metals having an atomic mass of greater than 26 g/mol. The positive charge on the metal can in particular assume a value between 2 to 7 inclusive and is compensated in particular by n simply negatively charged perfluorinated sulfonimide anions. Preferably, n assumes a value between 2 and 4 inclusive. Particularly preferably, n is equal to 2. The radicals $R_1$ and $R_2$ are in particular a linear or branched partially or completely fluorinated alkyl substituent having 1 to 10 carbon atoms, a partially or completely fluorinated aryl substituent having 1 to 20 carbon atoms or a partially or completely fluorinated arylalkyl substituent having 1 to 20 carbon atoms.

According to at least one embodiment, M is selected from the group of monovalent metals having an atomic mass of ≥39 g/mol. The positive charge on the metal assumes in particular a value of 1 and is compensated in particular by a single negatively charged perfluorinated sulfonimide anion. The radicals $R_1$ and $R_2$ are selected in particular from a group consisting of a linear or branched partially or completely fluorinated alkyl substituent having 1 to 10 carbon atoms, a partially or completely fluorinated aryl substituent having 1 to 20 carbon atoms and a partially or completely fluorinated alkylaryl substituent having 1 to 20 carbon atoms.

According to at least one embodiment, the organic layer is formed as a hole-injection layer and/or hole-transport layer. In addition, the hole-injection layer and/or hole-transport layer can consist of or contain the fluorinated sulfonimide metal salt. In other words, the main task of the organic layer is to inject and/or transport holes, also called defect electrons or positive charge carriers.

According to at least one embodiment, the organic layer is hole-transporting, and its main task is therefore to transport holes, and the fluorinated sulfonimide metal salt is formed as a p-type dopant. In addition, the organic layer has a matrix material, wherein the p-type dopant acts at least partially or completely as an electron acceptor with respect to the matrix material. In particular, a coordinative binding with a binding and anti-binding orbital is formed.

Within the meaning of embodiments of the invention, the designation 'p-type dopant' comprises, in particular, materials which have a lewis acidity at least partially or completely with regard to the matrix material or act as a lewis acid and/or are capable to form bonds, in particular covalent, ionic or coordinative bonds, with the matrix material in which these materials (albeit only formally) act as a lewis acid.

According to at least one embodiment, the matrix material is a hole-transport material. In other words, the organic layer is then a hole-transporting layer.

According to at least one embodiment, the matrix material is selected from a group consisting of HTM014, HTM081, HTM163, HTM222, NHT5, NHT49, NHT51, EL-301, HTM226, HTM355, HTM133, HTM334, HTM604 and EL-22T. The abbreviations denote the manufacturers' names, for example, of Merck or Novaled.

According to at least one embodiment, the hole-transporting layer has a layer thickness of between 1 nm and 1000 nm, preferably between 30 nm and 300 nm, for example, 200 nm.

According to at least one embodiment, the p-type dopant has a proportion between 1% by volume or 5% by volume and 50% by volume, in particular between 1% by volume and 30% by volume, inclusive, particularly preferably between 2% by volume and 20% by volume, inclusive, in the organic layer.

The degree of doping can be adapted to the charge transport required for the component. In the components, in particular in the case of organic light-emitting diodes, a balanced charge transport is important, which means that an equilibrium has to be present between electrons and holes. An exciton, for example, is used to generate light in a light-emitting layer of an organic light-emitting diode, formed from a hole and an electron, for the emission of light, so that as many electrons and holes as possible should be present in the light-emitting layer, in order to obtain an efficient component. The service life of the component can also be improved by a good charge balance, since excess charge carriers (for example, holes or radicals) can lead to degradation, for example, by oxidation, of the materials.

According to at least one embodiment, the organic layer is a charge carrier generation layer. In particular, the organic electronic component is formed as a tandem OLED, i.e., has at least two organic light-emitting layers which are separated from one another by the charge carrier generation layer.

According to at least one embodiment, the organic layer is produced by co-deposition of the matrix material and the p-type dopant via physical vapour deposition.

According to at least one embodiment, the organic layer is produced by means of a wet-chemical method.

According to one embodiment, the matrix material and the p-type dopant can be used both in the gas phase and in the liquid phase, that is to say a wet-chemical process. In the gas phase deposition, both the p-type dopant and the matrix material are jointly used, preferably from different sources in the high vacuum, vaporized and deposited as a layer. During processing from the liquid phase, the p-type dopant and the matrix material are dissolved in a solvent and by means of printing techniques, spin coating, knife coating, solder coating, etc. The finished layer is obtained by evaporation of the solvent. In this case, any doping ratios can be set by differing the mass ratios of p-dopant to matrix material.

All matrix materials which can be separated from the gas phase are possible. The following matrix materials can preferably be processed by means of a solvent process or wet chemical process:

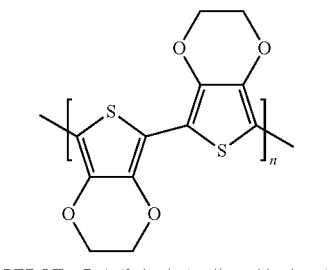

PEDOT = Poly(3,4-ethylendioxythiophene)
CAS: 126213-51-2

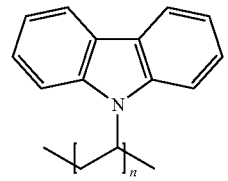

PVK = Poly(9-vinylcarbazole)
CAS: 25067-59-8

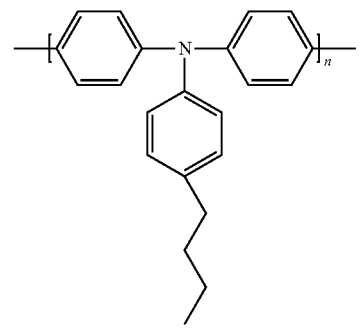

PTPD = Poly(N,N'-bis(4-butylphenyl)-N,N'-bis(phenyl)benzidine

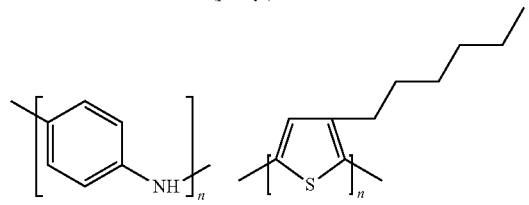

PANI = Polyaniline          P3HT = Poly(3-hexylthiophene)
CAS: 25233-30-1              CAS: 104934-50-1

BRIEF DESCRIPTION OF THE DRAWINGS

Furthermore, matrix materials which are referred to as "small molecules" can particularly preferably be processed by means of a solvent process. This substance class is known to the person skilled in the art and includes, for example, Spiro-TAD (2,2',7,7'-Tetrakis-(N,N-diphenylamino)-9,9'-spirobifluorene) and Spiro-TrB (2,2',7,7'-Tetrakis-(N,N'-di-p-methylphenylamino)-9,9'-spirobifluorene and further materials such as are listed in this application as matrix materials.

According to at least one embodiment, the matrix material of the organic electronic component comprises one or more of the following materials, which can be used, for example, in a hole-transporting layer:

Figure 1:
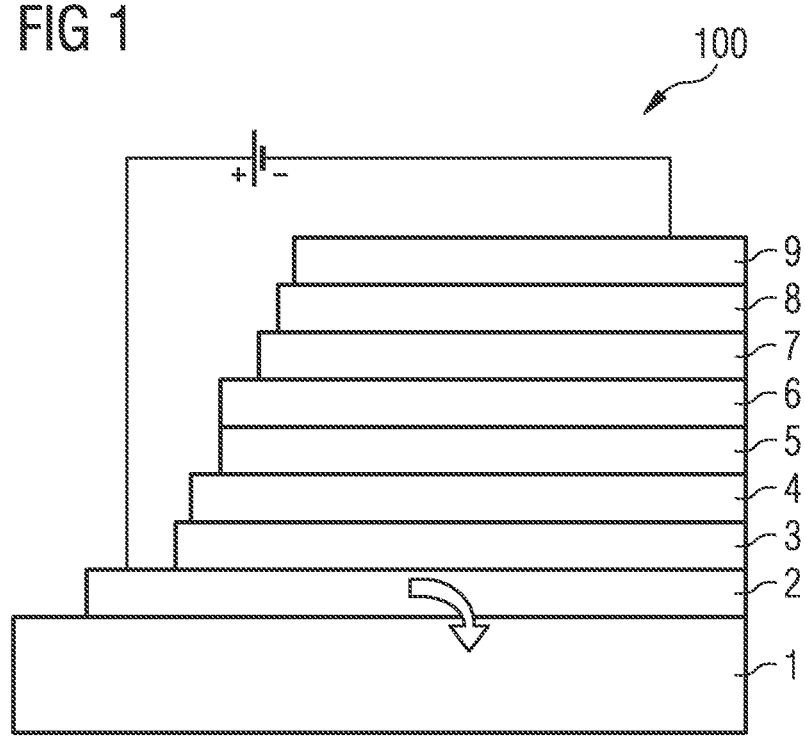

N,N'-Bis(naphthalen-1-yl)-N,N'-bis(phenyl)-9,9-dimethyl-fluorene,
N,N'-Bis(3-methylphenyl)-N,N'-bis(phenyl)-9,9-dimethyl-fluorene,
N,N'-Bis(naphthalen-1-yl)-N,N'-bis(phenyl)-9,9-dimethyl-fluorene,
N,N'-Bis(naphthalen-1-yl)-N,N'-bis(phenyl)-2,2-dimethylbenzidine,
N,N'-Bis(3-methylphenyl)-N,N'-bis(phenyl)-9,9-spirobifluorene,
2,2',7,7'-Tetrakis(N,N-diphenylamino)-9,9'-spirobifluorene,
N,N'-Bis(naphthalen-1-yl)-N,N'-bis(phenyl)-benzidine,
N,N'-Bis(naphthalen-2-yl)-N,N'-bis(phenyl)-benzidine,
N,N'-Bis(3-methylphenyl)-N,N'-bis(phenyl)-benzidine,
N,N'-Bis(3-methylphenyl)-N,N'-bis(phenyl)-9,9-dimethyl-fluorene,
N,N'-Bis(naphthalen-1-yl)-N,N'-bis(phenyl)-9,9-spirobifluorene,
Di-[4-(N,N-ditolyl-amino)-phenyl]cyclohexane,
2,2',7,7'-tetra(N,N-di-tolyl)amino-spiro-bifluorene,
9,9-Bis[4-(N,N-bis-biphenyl-4-yl-amino)phenyl]-9H-fluorene,
2,2',7,7'-Tetrakis(N,N-naphthalenyl(phenyl)-amino]-9,9'-spirobifluorene,
2,7-Bis(N,N-bis(9,9-spiro-bifluorene-2-yl)-amino]-9,9'-spirobifluorene,
2,2'-Bis(N,N-bis(biphenyl-4-yl)amino]-9,9'-spirobifluorene,
N,N'-bis(phenanthren-9-yl)-N,N'-bis(phenyl)-benzidine,
N,N,N',N'-tetra-naphthalen-2-yl)-benzidine,
2,2'-Bis(N,N-di-phenyl-amino)-9,9-spirobifluorene,
9,9-Bis[4-(N,N-bis-naphthalen-2-yl-amino)phenyl]-9H-fluorene,
9,9-Bis[4-(N,N'-bis-naphthalen-2-yl-N,N'-bis-phenyl-amino)-phenyl]-9H-fluorene,
Titanium oxide phthalocyanine,
Copper phthalocyanine,
2,3,5,6 Tetrafluoro 7,7,8,8, tetracyano-quinodimethane,
4,4'4"-Tris(N-3-methylphenyl-N-phenyl-amino)triphenylamine,
4,4',4"-Tris(N-(2-naphthyl)-N-phenyl-amino)triphenylamine,
4,4',4"-Tris(N-(1-naphthyl)-N-phenyl-amino)triphenylamine,
4,4',4"-Tris(N,N-diphenyl-amino)triphenylamine,
Pyrazino[2,3-f][1,10]phenanthroline-2,3-dicarbonitrile,
N,N,N',N'-Tetrakis(4-methoxyphenyl)benzidine.

However, the possible matrix materials are not restricted to said materials. Other materials, such as the commercially available matrix materials by Merck, Novaled, Lumtec, Sensient, and Hodogaya with the product designations HTM014, HTM081, HTM163, HTM222, NHT5, NHT49, NHT51, EL-301, EL-22T are particularly well suited. However, comparable commercially available materials can also be used.

According to at least one embodiment, the component comprises a hole-injecting layer. The hole-injecting layer can comprise the p-type dopant or the p-type dopant and the matrix material. The matrix materials mentioned can be used as matrix materials for a hole-transporting and electron-blocking layer.

In one embodiment, the degree of doping in volume percent of the p-type dopant in relation to the volume of the matrix material is between 70 vol-% and 100 vol-% in the hole-injecting layer.

In one embodiment, the hole-injecting layer consists of the p-type dopant.

According to at least one embodiment, the organic electronic component is selected from a group consisting of organic transistors, organic light-emitting diodes, organic light-emitting electrochemical cells, organic solar cells and organic photodetectors.

In one embodiment, the organic transistor is a field-effect transistor or a bipolar transistor. Bipolar transistors are described in more detail, for example, in DE 10 201 041331 A1.

In one embodiment, the organic electronic component is an organic light-emitting diode.

In one embodiment, the organic electronic component is an organic light-emitting diode and the organic layer is formed as a hole-injection layer and consists of the fluorinated sulfonimide metal salt. Alternatively, the hole-injection layer can comprise the fluorinated sulfonimide metal salt.

In one embodiment, the organic light-emitting diode comprises a light-emitting layer.

In one embodiment, the matrix material and the p-type dopant form an electron-blocking layer in the organic electronic component. The electron-blocking layer can comprise or consist of the p-type dopant and the matrix material.

In one embodiment, the matrix material of an electron-blocking layer is at least partially electron-conducting.

Typical matrix materials of an electron-blocking layer are in this case:

2,2',2"-(1,3,5-Benzinetriyl)-tris(1-phenyl-1-H-benzimidazole),
2-(4-Biphenylyl)-5-(4-tert-butylphenyl)-1,3,4-oxadiazole,
2,9-Dimethyl-4,7-diphenyl-1,10-phenanthroline,
8-Hydroxyquinolinolato-lithium,
4-(Naphthalen-1-yl)-3,5-diphenyl-4H-1,2,4-triazole,
1,3-Bis[2-(2,2'-bipyridine-6-yl)-1,3,4-oxadiazo-5-yl]benzene,
4,7-Diphenyl-1,10-phenanthroline,
3-(4-Biphenylyl)-4-phenyl-5-tert-butylphenyl-1,2,4-triazole,
Bis(2-methyl-8-quinolinolate)-4-(phenylphenolato)aluminum,
6,6'-Bis[5-(biphenyl-4-yl)-1,3,4-oxadiazo-2-yl]-2,2'-bipyridyl,
2-phenyl-9,10-di(naphthalene-2-yl)-anthracene,
2,7-Bis[2-(2,2'-bipyridine-6-yl)-1,3,4-oxadiazo-5-yl]-9,9-dimethylfluorene,
13-Bis[2-(4-tert-butylphenyl)-1,3,4-oxadiazo-5-yl]benzene,
2-(naphthalen-2-yl)-4,7-diphenyl-1,10-phenanthroline,
Tris(2,4,6-trimethyl-3-(pyridin-3-yl)phenyl)borane,
1-methyl-2-(4-(naphthalen-2-yl)phenyl)-1H-imidazo[4,5-f][1,10]phenanthroline.

Blocking and limiting the electron flow is of high importance, for example, for highly efficient organic light-emitting diodes.

According to at least one embodiment, the organic electronic component comprises a cathode, an anode and a hole-transporting layer, which comprises or consists of the matrix material and the p-type dopant.

According to at least one embodiment, the hole-transporting layer is arranged between the anode and the cathode.

The fact that a layer "is arranged between two other layers" can mean here and below that the one layer is arranged directly at, i.e., in direct mechanical and/or electrical contact with, one of the two other layers. Alternatively, it can also mean that the one layer is in indirect contact with one of the two other layers and in direct mechanical and/or electrical contact or in indirect contact with other layers. In the case of indirect contact, further layers can be arranged between the one and at least one of the two other layers.

According to at least one embodiment, the organic electronic component comprises a light-emitting layer. The light-emitting layer is designed for generating light or providing charge carriers for a stacked element in an operating state of an organic light-emitting diode.

Materials which have a radiation emission on the basis of fluorescence or phosphorescence are suitable as materials for the light-emitting layer. Organic or organometallic compounds, such as derivatives of polyfluorene, are preferably used as organic materials, polythiophene and polyphenylene, for example, 2- or 2,5-substituted poly-p-phenylene vinylene and/or metal complexes, for example, iridium complexes, such as blue-phosphorescent FIrPic (bis (3,5-difluoro-2-(2-pyridyl) phenyl-(2-carboxypyridyl)-iridium III), green phosphorescent Ir(ppy) (Tris(2-phenylpyridin) iridium III) and/or red phosphorescent Ru (dtb-bpy)$_3$*2 (PF$_6$) (Tris[4,4'-di-tert-butyl-(2,2')-bipyridin]ruthenium(III) complex), and blue fluorescent DPAVBi (4,4-Bis[4-(di-p-tolylamino)styryl]biphenyl), green fluorescent ITPA (9,10-Bis[N,N-di-(p-tolyl)-amino]anthracene) and/or red fluorescent DCM2 (4-Dicyanomethylen)-2-methyl-6-julolidyl-9-enyl-4H-pyrane) as non-polymeric emitters. The organic light-emitting diode can also have a plurality of light-emitting layers.

In one embodiment, the hole-transporting layer is arranged between the light-emitting layer and the anode. In a CGL, the latter is located, optionally separated by a thin separator, in the immediate vicinity of an electron-transporting layer.

According to at least one embodiment, the organic electronic component comprises a cathode, an anode and a hole-injecting layer, which comprises the matrix material and/or the p-type dopant or consists of these materials.

According to at least one embodiment, the hole-injecting layer is arranged between the anode and the cathode.

According to at least one embodiment, the hole-injecting layer is in direct mechanical and/or electrical contact with the anode.

According to at least one embodiment, the hole-injecting layer is arranged between the light-emitting layer and the anode.

According to at least one embodiment, the organic electronic component comprises a cathode, an anode and an electron-blocking layer, which comprises the matrix material and the p-type dopant or consists of these materials.

According to at least one embodiment, the electron-blocking layer is arranged between the anode and the cathode.

According to at least one embodiment, the electron-blocking layer is arranged between the light-emitting layer and the anode.

According to at least one embodiment, the electron-blocking layer is in direct mechanical and/or electrical contact with the light-emitting layer.

According to at least one embodiment, the component comprises an anode, a hole-injecting layer and a hole-transporting layer. The hole-injecting layer is arranged between the hole-transporting layer and the anode. The hole-transporting layer comprises the matrix material and the p-type dopant or consists thereof and/or the hole-injecting layer comprises the p-type dopant or the matrix material and the p-type dopant or consists thereof. In particular, there is a direct mechanical and/or electrical contact between the anode and the hole-injecting layer and between the hole-injecting layer and the hole-transporting layer.

According to at least one embodiment, the component comprises an anode, a hole-injecting layer, a hole-transporting layer and an electron-blocking layer. The hole-injecting layer is arranged between the hole-transporting layer and the anode. The hole-transporting layer comprises the matrix material and the p-type dopant or consists thereof and/or the electron-blocking layer comprises the matrix material and the p-dopant or consists thereof and/or the hole-injecting layer comprises the p-type dopant or the matrix material and the p-type dopant or consists thereof. In particular, there is a direct mechanical and/or electrical contact between the anode and the hole-injecting layer, between the hole-injecting layer and the hole-transporting layer and between the hole-transporting layer and the electron-blocking layer. If a light-emitting layer is present, said layer is preferably in direct mechanical and/or electrical contact with the electron-blocking layer.

The organic light-emitting diode can have layers with organic polymers, organic oligomers, organic monomers, organic small non-polymeric molecules ("small molecules") or combinations thereof. The organic light-emitting diode can, for example, comprise electron-injecting layers in addition to said layers, electron-transporting layers and/or hole-blocking layers. Materials for these layers are known to the person skilled in the art.

According to a further embodiment, the organic light-emitting diode has a substrate on which the anode and the cathode are applied. The substrate can have, for example, one or more materials in the form of a layer, a plate, a film or a laminate, which are selected from glass, quartz, plastic, metal, silicon wafers.

In one embodiment, the anode is arranged above the substrate and is preferably in direct mechanical contact therewith.

An encapsulation arrangement can be arranged above the anode and the cathode, preferably above the cathode, by which the electrodes and the further layers are protected from harmful external influences such as, for example, moisture, oxygen, hydrogen sulphide or other substances. The encapsulation arrangement is preferably in direct mechanical contact with the cathode.

With regard to the basic structure of an organic light-emitting diode, in this case, for example, with regard to the structure, the layer composition and the materials of the substrate, the anode and the cathode and the encapsulation arrangement, reference is made to the publication WO 2010/066245 A1, which, in particular with respect to the structure, the layer composition and the materials of the substrate, the anode and the cathode and the encapsulation arrangement is hereby expressly incorporated by reference.

Embodiments of the invention further relates to the use of a fluorinated sulfonimide metal salt. The fluorinated sulfonimide metal salt described above is preferably used. In particular, the fluorinated sulfonimide metal salt is used as a p-dopant for increasing the electrical conductivity in an organic layer of an organic electronic component. In particular, the organic electronic component is the component described above. All statements and definitions made for the organic electronic component also apply to the use of a fluorinated sulfonimide metal salt and vice versa.

Here and below, 'electrical conductivity' is understood to mean the ability of the fluorinated sulfonimide metal salt as a dopant in a matrix material. Electrical conductivity can also mean, with respect to the hole-injection layer which consists of the fluorinated sulfonimide metal salt, the ability of the fluorinated sulfonimide metal salt to conduct current. The conductivity can be determined, for example, using a Keithley source meter. The Keithley source meter is a combination of voltage source and measurement device, to which a voltage can be applied and then the current can be measured. The voltage can then be scanned from, for example, −5 volts to +5 volts, as a result of which the current-voltage characteristic curves shown in the subsequent figures are obtained. The conductivities can be determined from these figures or statements can be made about the conductivity mechanism.

DETAILED DESCRIPTION OF ILLUSTRATIVE EMBODIMENTS

Further advantages, advantageous embodiments and developments will become apparent from the exemplary embodiments described below in conjunction with the figures.

Figure 2:
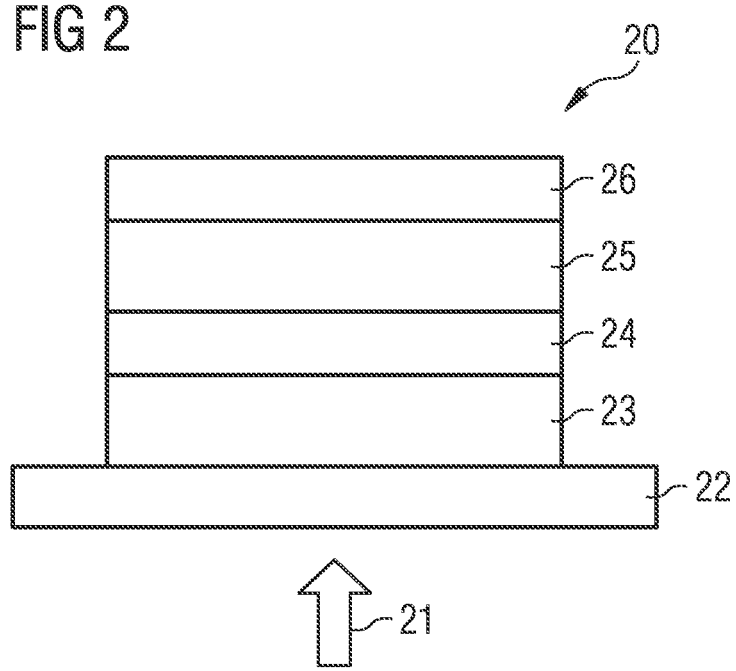
Figure 3A:
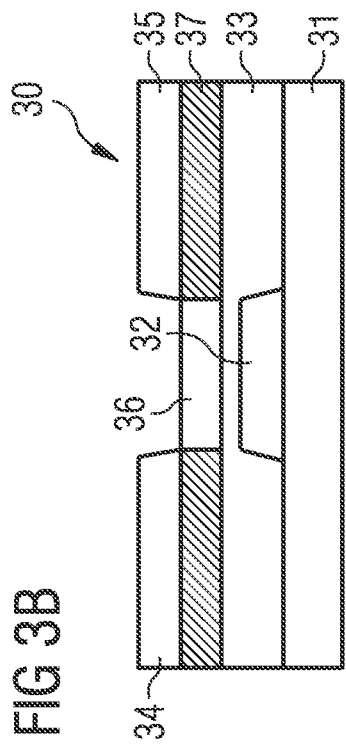
Figure 3B:
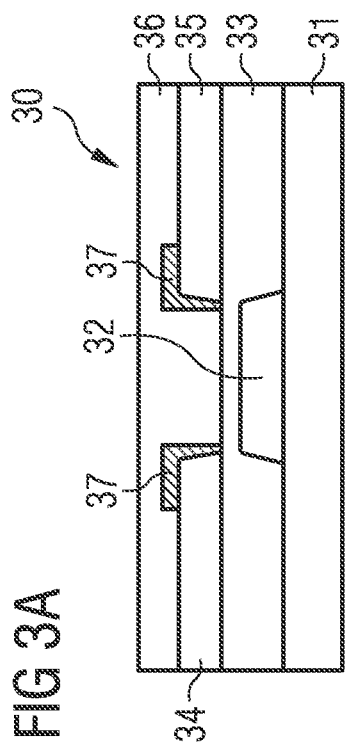
Figure 3C:
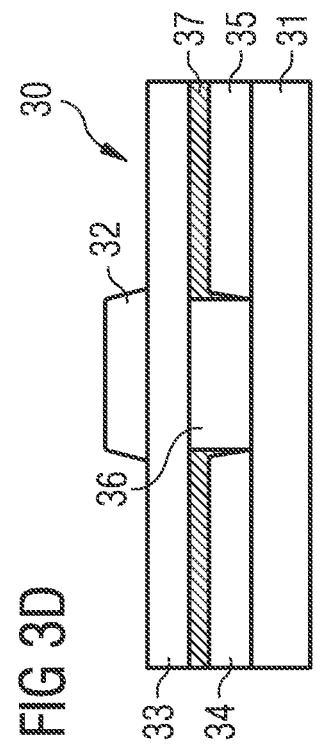
Figure 3D:
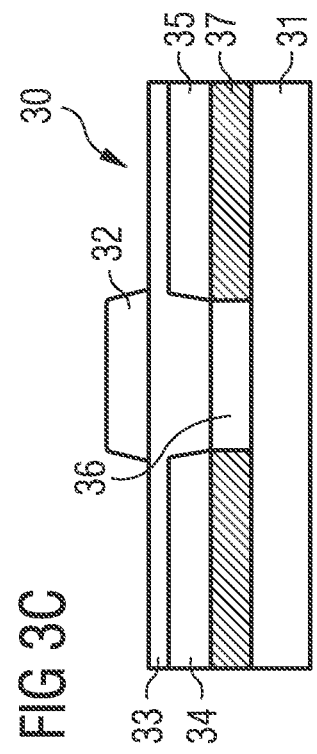
Figure 3E:
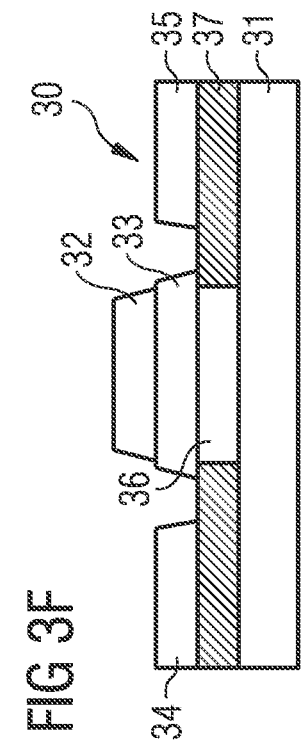
Figure 3F:
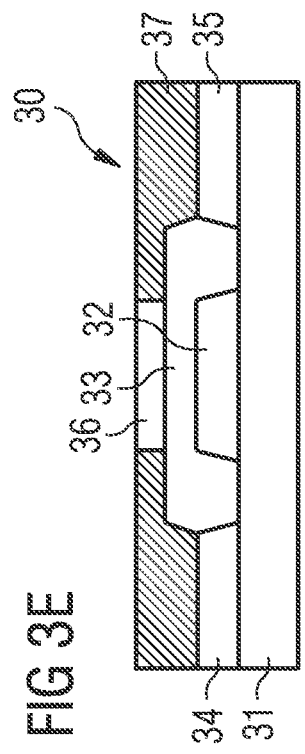
Figure 4:
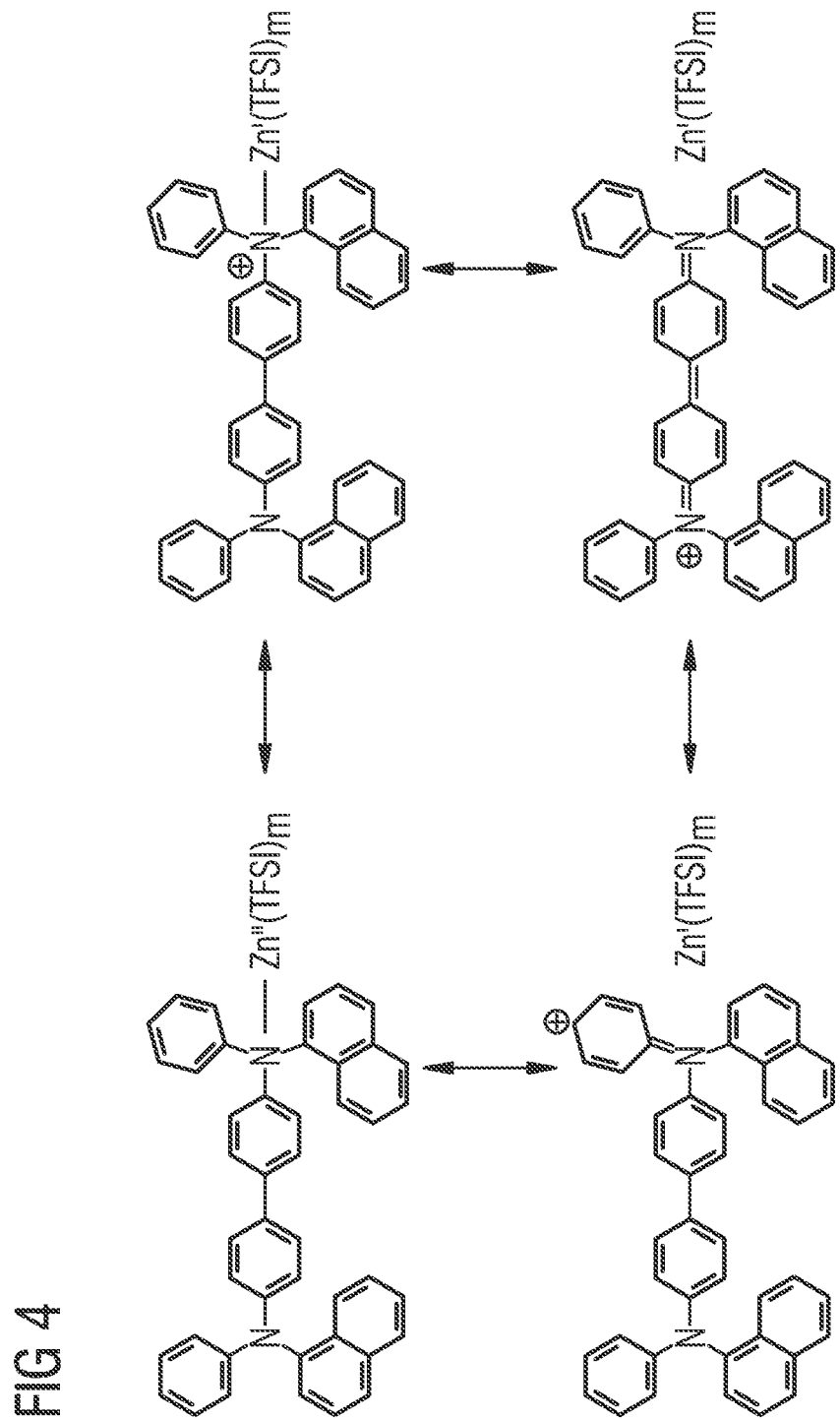
Figure 5:
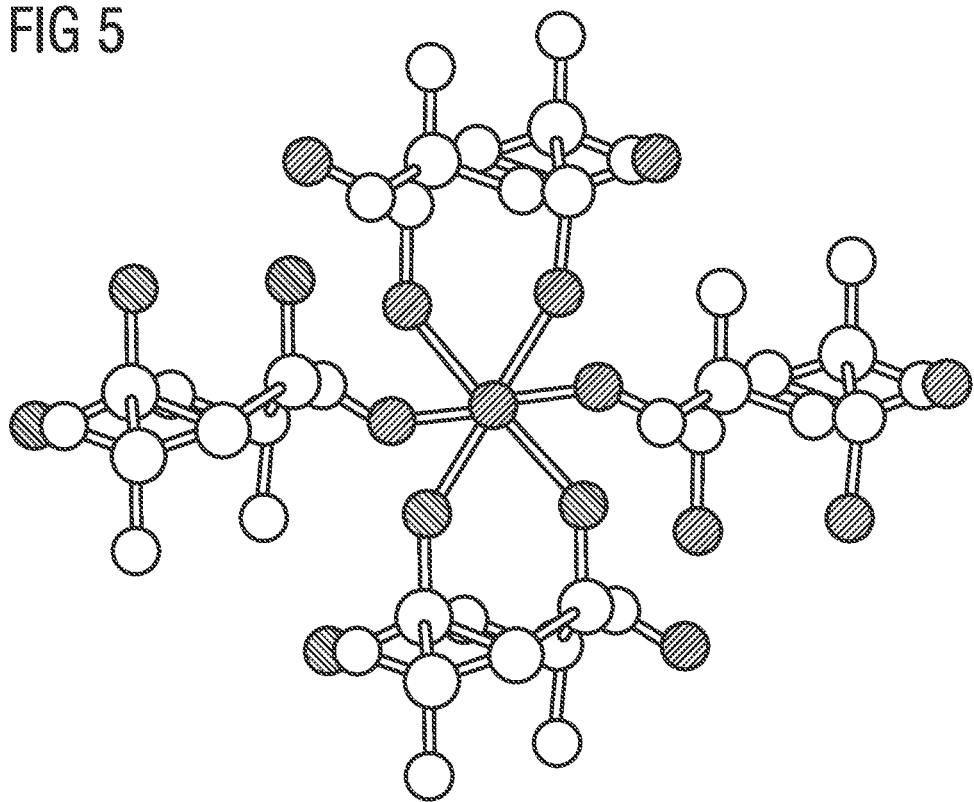

FIG. 1 shows a schematic side view of an exemplary embodiment of an organic light-emitting diode described here;

FIG. 2 shows a schematic side view of an exemplary embodiment of an organic solar cell described here;

FIGS. 3A to 3F show schematic side views of exemplary embodiments of an organic field-effect transistor described here;

FIG. 4 shows the connection of a fluorinated sulfonimide metal salt to a matrix material according to an embodiment;

FIG. 5 shows a fluorinated sulfonimide metal salt according to an embodiment;

FIGS. 6 to 11 each show one or more current voltage characteristic curves of one exemplary embodiment of an organic electronic component according to an embodiment; and FIG. 12 shows measurement data of physical properties according to a plurality of exemplary embodiments and a comparative example.

In the exemplary embodiments and figures, identical or identically acting elements can in each case be provided with the same reference symbols. The elements illustrated and their size relationships among one another are not to be regarded as true to scale. Rather, individual elements, such as, for example, layers, components and regions, can be represented with an exaggerated size for better representability and/or for a better understanding.

FIG. 1 shows an organic electronic component, in particular an organic light-emitting diode 100, according to one embodiment. The organic light-emitting diode 100 comprises a substrate 1, for example, made of glass. An anode 2 is arranged above the substrate, which is formed, for example, from indium tin oxide or other transparent conductive oxide (TCO). A hole-injecting layer 3, a hole-transporting layer 4 and a light-emitting layer 5 are arranged above the anode 2. The hole-transporting layer 4 as an organic layer comprises in particular a matrix material, for example, HTM, and a fluorinated sulfonimide metal salt as a p-dopant according to formula 1. The p-type dopant in particular accounts for 15% by volume based on the volume of the matrix material. The hole-transporting layer 4 has a layer thickness of approximately 200 nm. A hole-blocking layer 6 is arranged above the light-emitting layer 5, followed by an electron-transporting layer 7, an electron-injecting layer 8 and a cathode 9, for example, made of aluminum. The light-emitting layer 5 can contain an electron- and/or hole-transporting material and one or more phosphorescent or fluorescent emitters. Materials for the electron-transporting layer 7, the electron-injecting layer 8 and the hole-injecting layer 3 are known to the person skilled in the art and are therefore not explained further at this point. For example, the electron-transporting layer 7 is made of 2-(4-bivinylyl)-5-(4-tert-butylvinyl)-1,3,4-oxadiozole with an n-dopant, for example, NDN-1 or calcium. The electron-injecting layer 8 can be made of 2,9-dimethyl-4,7-divinyl-1,10-phenanthroline (BCP) or lithium fluoride (LiF). The hole-injecting layer 3 can be made of champhersulfonic acid-doped poly (3,4-ethylenedioxythiophene).

An electron-blocking layer (not shown here) can be arranged between the hole-transporting layer 4 and the light-emitting layer 5. Materials for the electron-blocking layer are known to the person skilled in the art, for example, bis (2-methyl-8-quinolinolate)-4-(vinylphenolato) aluminum. Alternatively or in addition to the hole-transporting layer 4, the electron-blocking layer can consist of the matrix material, such as HTM-014, and the p-type dopant, such as copper trifluoromethylsulfonimide.

FIG. 2 shows an organic electronic component according to an embodiment. FIG. 2 shows an exemplary embodiment of an organic solar cell having a PIN structure 20, which converts light 21 into electrical current. The solar cell 20 comprises or consists of an anode made of indium tin oxide 22, a hole-transporting layer 23, an absorption layer 24, a doped electron-transporting layer 25 and a cathode 26. The hole-transporting layer 23 consists of a matrix material NPB (N,N'-Bis(naphthalen-1-yl)-N,N'-bis(phenyl)-benzidine) and the fluorinated sulfonimide metal salt and has a layer thickness of 150 nm. The p-type dopant is present in the matrix material with a share of 15% by volume relative to the volume of the matrix material. The materials for the further layers are known to the person skilled in the art. Light from the surroundings is absorbed in the absorption layer 24. As a result of the absorption of the light, a molecule of the absorption layer 24 merges into the excited state and charge separation occurs. An exciton, that is to say an electron-hole pair, is formed during this charge separation. These non-similar charged charges must now be separated from one another. This is possible in particular if the electron is taken up by a strong acceptor and/or the hole is taken up by a strong donor. Such a strong acceptor can be the hole-transporting layer 23 doped with the dopant according to embodiments of the invention. Alternatively, such an acceptor can be represented in the region of the charge carrier extraction of the charge carriers formed in a PIN structure. The hole-transporting layer 23 with the fluorinated sulfonimide metal salt according to embodiments of the invention as a p-dopant also has a positive effect on the charge extraction and thus on the efficiency of organic solar cells.

FIGS. 3A to 3F illustrate exemplary embodiments of organic field-effect transistors 30. A gate electrode 32, a gate dielectric 33, a source and drain contact 34 and 35 and an organic semiconductor layer 36 are arranged on a substrate 31. The hatched areas 37 show the hole-transporting layer and thus the points at which the matrix material of the organic semiconductor layer 36 is doped with the p-type dopant. The doping serves in particular for better charge trapping and extraction on the contacts.

FIG. 4 shows the formation of a positive charge and its delocalization using the example of the matrix material NPD as a hole-transport material and using the example of the fluorinated sulfonimide metal salt Zn(TFSI)m as a p-type dopant. The sulfonimide anions are abbreviated as TFSI and their number is abbreviated to m. The hole can be transmitted from one to the next NPD molecule by the so-called hopping mechanism. A conductivity path is advantageous, but is not absolutely necessary due to the possible hopping mechanism. The coordination number of zinc can change during the charge transfer, for example, by releasing a TFSI ligand. The aromatic hole transporter as a matrix material can also bind to the metal of the fluorinated sulfonimide metal salt via a p-bond.

The zinc complex as a p-type dopant serves here merely as an example and is not intended to be restrictive. The mechanism can also be transferred to other fluorinated sulfonimide metal salts. It can be seen from FIG. 4 that the fluorinated sulfonimide metal salt according to embodiments of the invention binds or coordinates to the matrix material and thus transfers a positive charge to the matrix material. The fluorinated sulfonimide metal salt can split off again, wherein the positive charge remains localized on the matrix material. The lower right and left structural formulae of FIG. 4 show a mesmerized stabilization of the positively charged matrix material. The charge is thus freely movable within the matrix molecule and can be forwarded to the next matrix molecule by the so-called hopping mechanism. Only a few percent, in particular 1-50%, preferably 5-30%, particularly preferably 15%, of the fluorinated sulfonimide metal salt, are necessary in order to obtain a free positive charge carrier, that is to say holes or electron deficits, in the hole transport material, in particular an organic light-emitting diode.

The matrix material, here the hole-transport material NPD, can also bind to m of the metal salt via a π-bond.

FIG. 5 shows the spatial arrangement of a fluorinated sulfonimide metal salt according to an embodiment. Embodiments of the invention relates to Zinc di[bis(trifluormethylsulfonyl)imide] (CAS number: 1616106-25-0). The coordination possibilities of the sulfonimide anion on the metal are shown. The sulfonimide anions therein bind both in a chelating manner via two oxygen atoms and simply via only one oxygen atom. In this example, four sulfonimide ligands bind to only one zinc(II) centre. This would lead to a doubly negative charge. The sulfonimide ligands which are only bound in a simple manner can, however, bind to a further zinc centre, as a result of which a type of coordination polymer having the formula $[Zn(TFSI)_2]_n$ is obtained in total. In the layer, this polymer is completely or partially split by the organic semiconductor. In this application, this is reproduced in a simplified manner as $[Zn(TFSI)_2]_n$. Depending on the metal, a binding of N or S of the sulfonimide to the metal is also conceivable. Due to the large number of metals in the periodic system, a high structural diversity is provided. The selection of the metal also influences the number of the simply negatively charged sulfonimide anions with its charge, in particular the TFSI anion, the sublimation temperature, the solubility and doping strength. These parameters can thus be set within wide limits and can be matched to the desired processing type, for example, the liquid processing, or the vacuum deposition and also to different hole-transport materials.

The fluorinated sulfonimide metal salts are distinguished by their high thermal stability and are available in particular for vacuum processing. FIG. 5 shows the coordination of the perfluoroalkyl sulfonimides to the metal, for example, zinc. The sulfonimides can be chelated via two oxygen atoms to the central atom copper.

Figure 6:
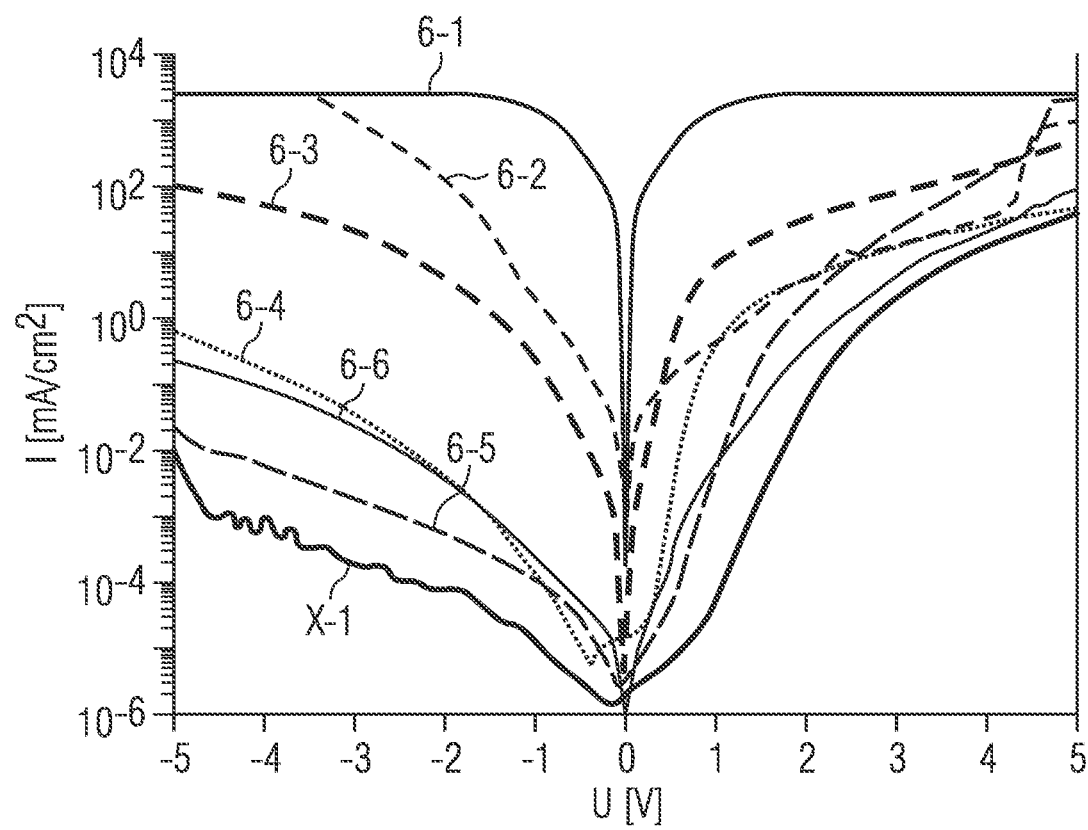

FIG. 6 shows a current voltage characteristic curve according to a plurality of embodiments and comparative examples. The current density I in mA/cm2 is represented in each case as a function of the voltage U in V. The fluorinated sulfonimide metal salt serves as a p-type dopant and HTM014 serves as a matrix material. In particular, the proportion of the fluorinated sulfonimide metal salt is 15% by volume. The matrix material has a proportion of 85% by volume.

The curve X-1 shows the current voltage characteristic curve of the matrix material HTM014 without the addition of a p-type dopant. The curves 6-1 to 6-6 each show a current voltage characteristic curve of the p-type dopant, fluorinated sulfonimide metal salt, embedded into the matrix material HTM014. The following fluorinated sulfonimide metal salts were used as the p-type dopant:

Curve 6-1: copper di [bis(trifluoromethylsulfonyl)imide] $Cu(TFSI)_2$,

Curve 6-2: potassium [bis(trifluoromethylsulfonyl)imide] K(TFSI),

Curve 6-3: zinc di [bis(trifluoromethylsulfonyl)imide] Zn(TFSI)2,

Curve 6-4: magnesium [bis(trifluoromethylsulfonyl)imide] Mg(TFSI)2.

Curve 6-5: lithium [bis(trifluoromethylsulfonyl)imide] Li(TFSI)

Curve 6-6: sodium [bis(trifluoromethylsulfonyl)imide] Na(TFSI).

The current voltage characteristic curves are intrinsically recorded. By way of example, the characteristic curves of Zn(TFSI)2 and $Cu(TFSI)_2$ are selected from the group of the divalent or higher-value metals having an atomic mass of ≥26 g/mol. Both materials result in virtually symmetrical characteristic curves with a very strong rise in the current density at very small voltages by doping into the hole-transport material HTM014. This indicates an efficient charge injection of both electrodes and thus a very strong doping effect. The current voltage characteristic curve of Mg(TFSI)2 is a comparative example. With this lighter element having an atomic mass of ≤26 g/mol, no efficient doping is achieved.

When using $Cu(TFSI)_2$ as a dopant, the hole injection is largely independent of the work function of the metal or semiconductor electrode, such as, for example, aluminum or ITO. $Cu(TFSI)_2$ has an exceptionally strong doping effect, owing to its strong lewis acid properties and the oxidic effect. In this case, $Cu^{2+}$ can be reduced to $Cu^{1+}$. The result is a wide selection of dopable hole-transport materials. This results from the low-lying LUMO level of $Cu(TFSI)_2$, which can also receive electrons from a comparatively high HOMO level of a hole-transport material.

The matrix materials described here are advantageously doped with strong dopants such as $Cu(TFSI)_2$. In particular, such matrix materials can be efficiently doped exclusively with extremely strong dopants, such as, for example, $Cu(TFSI)_2$. This effect is already known from the dopant Re2O7 as an extremely strong p-type dopant. Due to the small required amount of $Cu(TFSI)_2$, which in turn results from its strong doping effect, $Cu(TFSI)_2$ has a decisive cost advantage.

Alternatively, the organic layer can be formed as a hole-injection layer and consist of the fluorinated sulfonimide metal salt. The organic layer formed as a hole-injection layer preferably consists of $Cu(TFSI)_2$.

From the group of monovalent metals having an atomic mass of a ≥39 g/mol, the current-voltage characteristic curve of K(TFSI) is shown, by way of example. By doping into the hole-transport material HTM-014, a virtually symmetrical characteristic curve with a very strong rise in the current density at very small voltages is obtained. This indicates an efficient charge carrier injection of both electrodes and thus a very strong doping effect. The characteristic curves of Na(TFSI) and Li(TFSI) as the comparative example are shown. With these lighter elements having an atomic mass of <39 g/mol, no efficient doping is achieved.

The effectiveness of the p-type dopant is attributed to its lewis acid strength. In particular, the fluorinated sulfonimide metal salts have a PKs value of greater than 0. In this case, they are not superacids. Divalent or higher-valent metals have a higher lewis acid strength on account of their higher oxidation state, which is why lighter metals with an atomic mass of >26 g/mol are suitable as p-type dopants. Monovalent metals, on the other hand, are less lewis-acidic and are therefore suitable as p-type dopants only with an atomic mass of ≥39 g/mol. The atomic mass also increases the atomic number and thus the number of protons in the atomic nucleus. The higher the number of protons, the easier it is for an atom to take up an additional electron. Therefore, only metal salts from a certain sufficiently high atomic mass are suitable.

Preparation of Fluorinated Sulfonimide Metal Salts

1. Purification of Zinc Bis (Trifluoromethanesulfonimide), Zn(TFSI)2

Zn(TFSI)2 (CAS: 16161006-25-0) is commercially available from Sigma-Aldrich. The solid was sublimed in a high vacuum. The initial weight was 800 mg, and the final weight was 156 mg. The temperature was 174 to 178° C. at a pressure of approximately $5 \cdot 10^{-6}$ mbar. The product was obtained as a white amorphous solid.

2. Purification of Copper Bis (Trifluoromethanesulfonimide), Cu(TFSI)

Cu(TFSI)$_2$.xH2O (CAS: 1334406-76-6) is commercially available from Sigma-Aldrich. The solid was sublimated twice in a high vacuum. The first sublimation took place at an initial weight of 580 mg and a final weight of 331 mg at a temperature of 115 to 145° C. The product was obtained as a white amorphous solid. The second sublimation took place at an initial weight of 331 mg and a final weight of 266 mg at a temperature of 115 to 145° C. The product was obtained as a white amorphous solid.

3. Purification of Lithium Trifluoromethanesulfonimide, Li(TFSI)

Li(TFSI) (CAS: 90076-65-6) is commercially available from Sigma-Aldrich. The solid was distilled twice under high vacuum. The first distillation took place at an initial weight of 1.2 g and a final weight of 0.92 g. The white Li(TFSI) is liquid at 225 to 230° C. and distilled at 250 to 270° C. as a white amorphous solid. The second distillation took place at an initial weight of 0.92 g and a final weight of 0.40 g and a temperature of 250 to 270° C. The product is obtained as a white amorphous solid.

4. Purification of Sodium Trifluoromethanesulfonimide, Na(TFSI)

Na(TFSI) (CAS: 91742-21-1) is commercially available from Sigma-Aldrich. The solid was distilled twice under high vacuum. The first distillation took place at an initial weight of 505 mg and a final weight of 410 mg. The white Na(TFSI) is liquid at 265° C. and distilled at 270 to 295° C. as a white partially crystalline solid. The second distillation took place at an initial weight of 410 mg and a final weight of 270 mg and a temperature of 270 to 275° C. The product is obtained as a white solid.

5. Purification of Potassium-Trifluoromethanesulfonimide, K(TFSI)

K(TFSI) (CAS: 90076-67-8) is commercially available from Sigma-Aldrich. The solid was distilled twice in a high vacuum in the ball tube. The first distillation took place at an initial weight of 482 mg and a final weight of 366 mg. The white K(TFSI) is liquid at 205° C. and distilled at 270 to 290° C. The second distillation took place at an initial weight of 366 mg and a final weight of 241 mg at a temperature of 270 to 285° C.

6. Reference Component with Intrinsic Matrix Material, HTM-014

A reference system, a so-called majority carrier component (single-carrier device), has been constructed. The component has a substrate 1 made of glass. An anode 2 made of ITO (indium tin oxide) is arranged downstream of the substrate 1. An organic layer 3 comprising a matrix material made of HTM-014 is arranged downstream of the anode 2. The organic layer 3 has a layer thickness of approximately 200 nm. A cathode 9 made of aluminum is arranged downstream of the organic layer 3. Two components, each having 15 pixels and a pixel area of 4 mm2, are produced.

Figure 7:
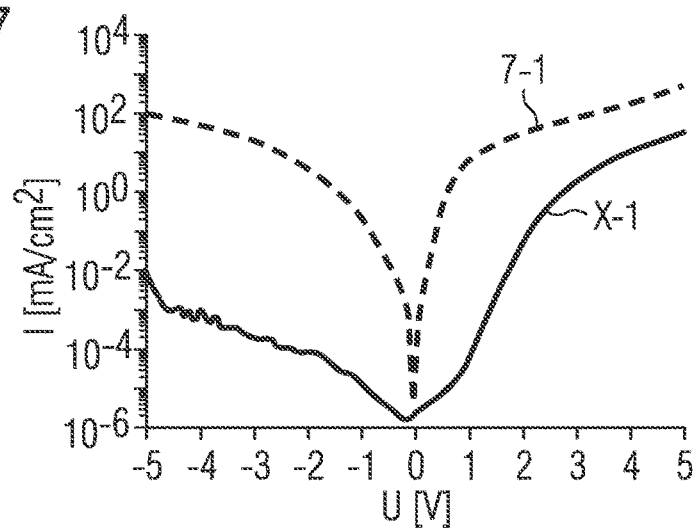
Figure 8:
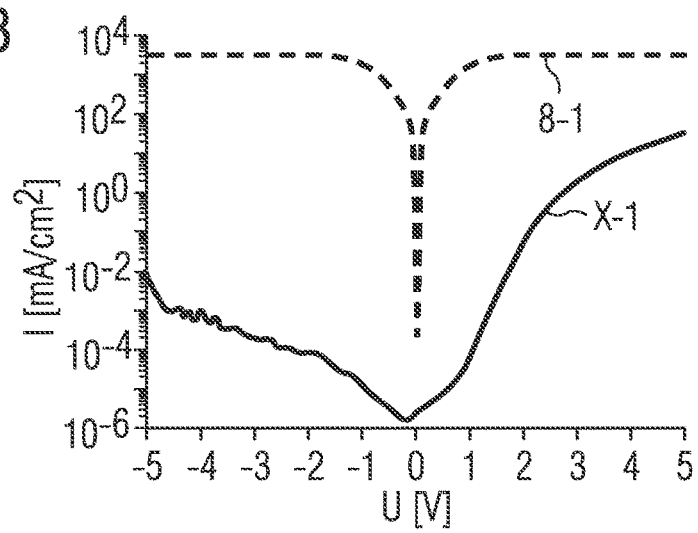
Figure 9:
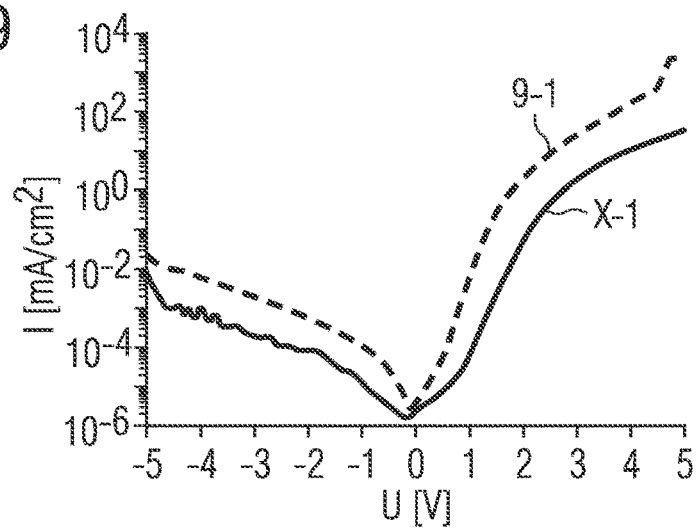

FIGS. 7 to 9 show the current voltage characteristic curves of this corresponding reference component as a continuous characteristic curve x-1.

7. Doping of the Matrix Material HTM-014 with Zn(TFSI)2

FIG. 7 shows the current voltage characteristic curve of the reference component x-1 (solid line) and of an exemplary embodiment 7-1 (dashed line). The current density I in mA/cm$^2$ is represented as a function of the voltage U in V. The organic electronic component is a majority carrier component. In order to demonstrate the doping effect in this component, it has glass as a substrate 1, ITO as an anode 2, a 200 nm thick organic layer 3 made of a matrix material HTM-014 doped with 15% by volume of Zn(TFSI)2 and a cathode 9 made of aluminum. Two components, each having 15 pixels and a pixel area of 4 mm2, are produced.

It can be seen from FIG. 7 that the doping has an effect on the current voltage characteristic curve. The current density rises sharply in the doped layer above and below 0 V, while for the intrinsic undoped layer (solid line) a typical diode characteristic curve is observed in which a clear overvoltage (built-in voltage) is necessary before the current density increases. In addition, this is the case with the intrinsic layer only at positive voltages, while the doped layer exhibits increased current densities even at negative voltages, and an efficient electron injection also from the anode 2 (ITO).

8. Doping of the Matrix Material HTM-014 with Cu(TFSI)$_2$

In order to demonstrate the doping effect, a majority carrier component having the following architecture was constructed:

Glass substrate 1,
ITO as the anode 2,
200 nm HTM-014 doped with 15 vol. % Cu(TFSI)$_2$ as the organic layer 3,
Aluminum as the cathode 9

Two components, each having 15 pixels and a pixel area of 4 mm2, are produced.

FIG. 8 shows the current voltage characteristic curve of this exemplary embodiment as a dashed line 8-1. It can be shown that the doping has a very strong effect on the current voltage characteristic curve. The current density rises very sharply in the doped layer above and below 0 V and rapidly reaches the maximum current density at a voltage >1 V, which has been set during the measurement, in order to protect the component from excessive currents. The current voltage characteristic curve shows that Cu(TFSI)$_2$ is an extremely strong p-type dopant.

9. Doping of the Matrix Material HTM-014 with Li(TFSI)

FIG. 9 shows the current voltage characteristic curve of a comparative example. In order to demonstrate the low doping effect, a majority carrier component having the following component architecture was constructed:

Glass substrate 1,
ITO as the anode 2,
200 nm HTM-014 doped with 15 Vol. % Li(TFSI) as an organic layer,
Aluminum as the cathode 9

Two components, each having 15 pixels and a pixel area of 4 m2, are produced.

The dashed characteristic curve 9-1 of FIG. 9 shows the current voltage characteristic curve of this structure. It can be shown that the doping with lithium trifluoromethylsulfonimide is less efficient and has almost no effect on the current-voltage characteristic curve. The current density in the doped layer is only very slightly above the current density in the undoped reference component. Also, for example, the doping of spiro-MEOTAD with 12 vol.-% Li(TFSI) shows only one conductivity increase by two orders of magnitude ($\kappa = 0.2 \times 10^{-5}$ S/cm). This corresponds to a low to moderate doping effect. Due to the low doping effect with lithium trifluoromethylsulfonimide, this dopant is excluded according to embodiments of the invention.

Figure 10:
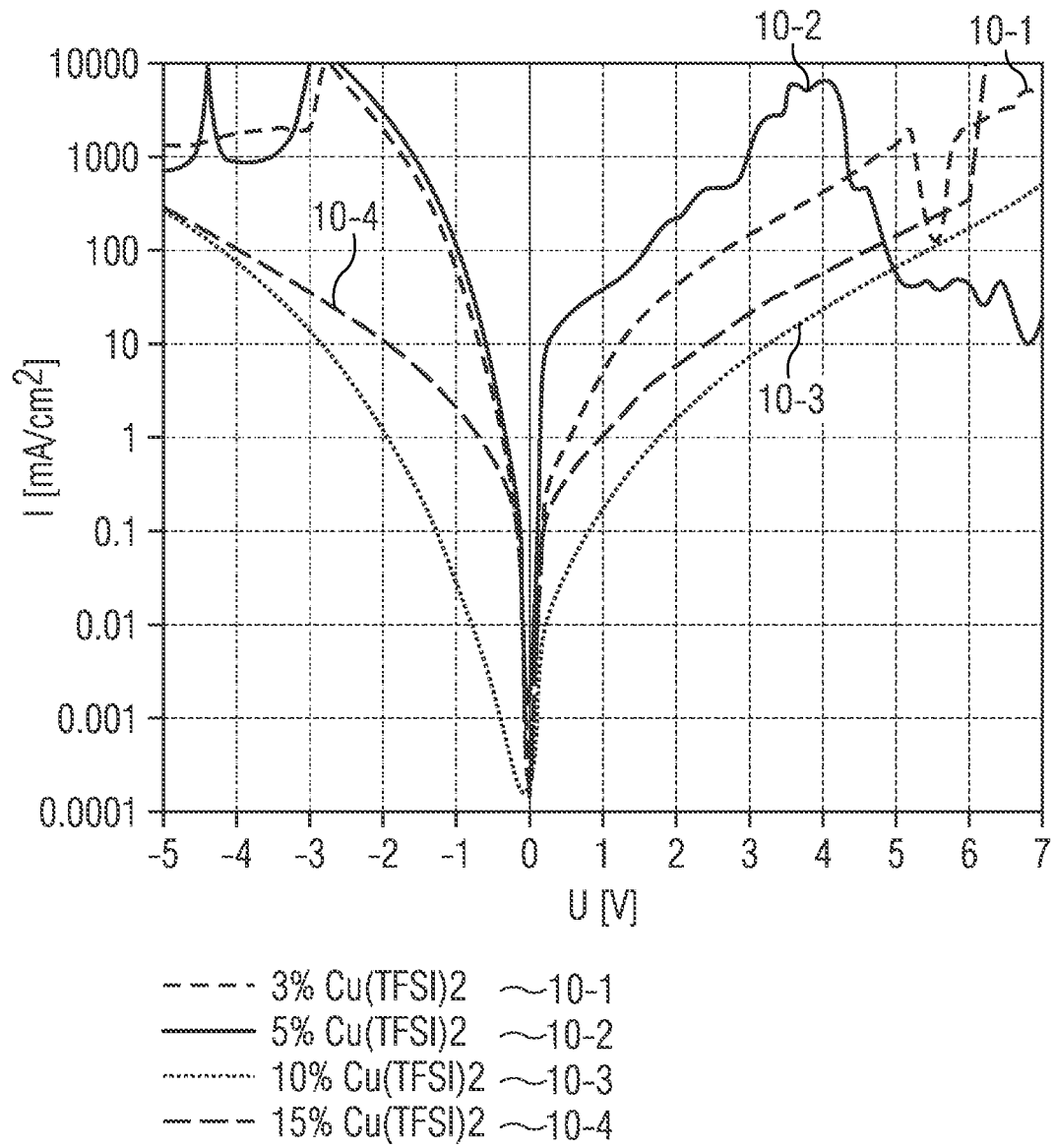
Figure 11:
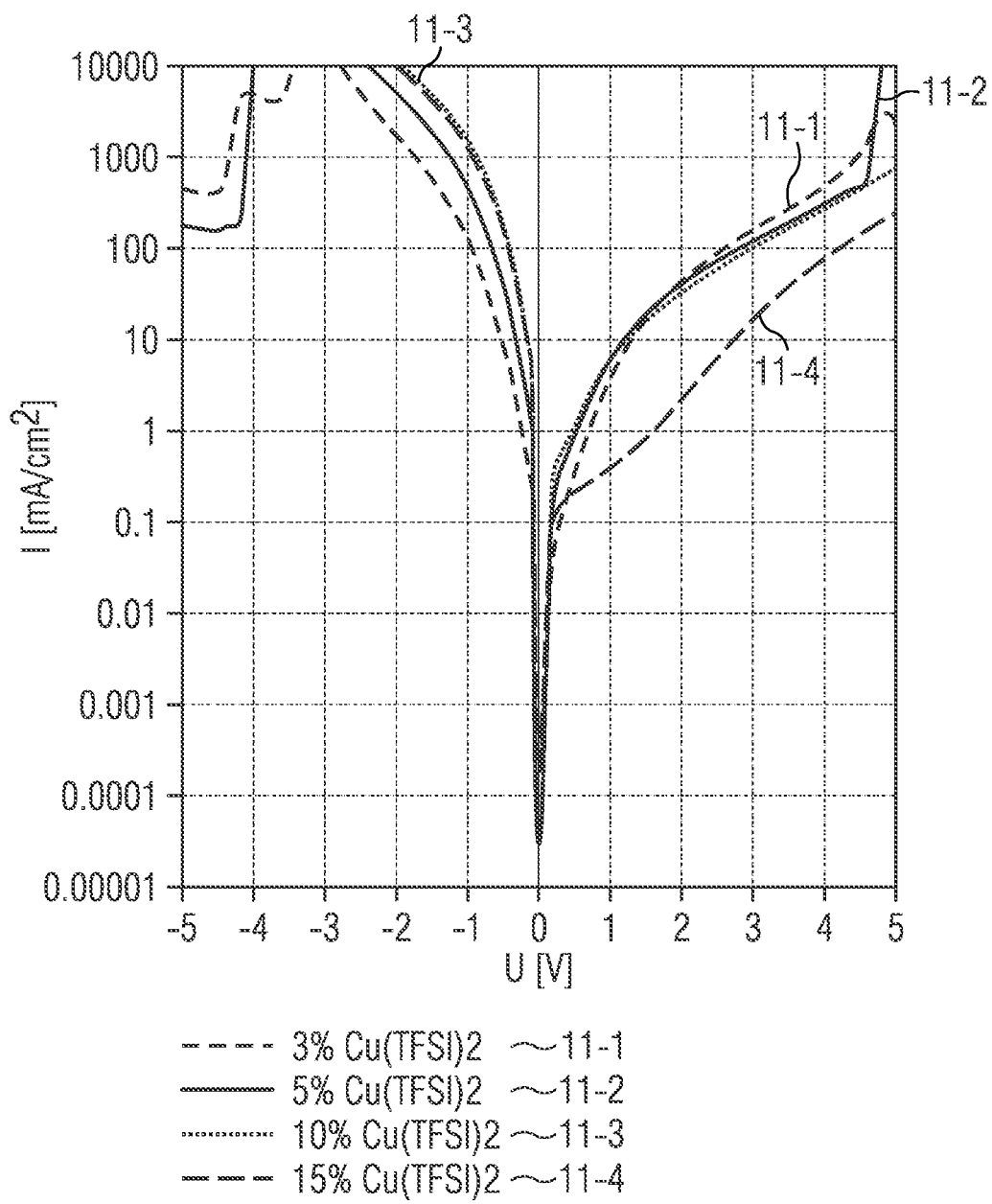

FIGS. 10 and 11 each show current-voltage characteristic curves according to a plurality of embodiments. Analogously to FIGS. 6 to 9, the current density I in mA/cm$^2$ is represented in each case as a function of the voltage U in V.

The curves 10-1 to 10-4 of FIG. 10 show a majority charge carrier component, in which the matrix material NHT-51 is doped with different concentrations of Cu(TFSI)$_2$.

The concentration of Cu(TFSI)$_2$ is 3% in curve 10-1, 5% in curve 10-2, 10% in curve 10-3, and 15% in curve 10-4. The percentages are in particular % by volume.

It can be seen from FIG. 10 that Cu(TFSI)$_2$ exhibits at these concentrations a strong doping effect and thus acts as a strong dopant. An optimum is achieved at a doping concentration of 5% with a tolerance of 3%, 2%, 1%, 0.5%, 0.3% or 0.1%, preferably exactly 5%.

The inventors have recognized that selecting the proportion of Cu(TFSI)$_2$ to lie in the concentration range of 3% to 15% (boundaries included) yields a strong doping effect.

FIG. 11 shows current voltage characteristic curves of majority charge carrier components in which Cu(TFSI)$_2$ is present, in different concentrations between 3% and 15%, as a dopant in the matrix material HTM-081.

It can be seen from FIG. 11 that Cu(TFSI)$_2$ also acts as a strong dopant in this matrix material at all concentrations. The strongest doping is expected at a concentration of between 3 and 10%.

In order to verify the doping properties of Cu(TFSI)$_2$, an organic electronic component having the following architecture is produced. The organic electronic component is preferably an OLED:

Glass substrate,
ITO as the anode,
70 nm NHT-51 doped with 3 to 15% by volume of Cu(TFSI)$_2$/reference dopant (R-D),
Electron-blocking layer,
Emission layer,
Hole-blocking layer,
Electron-transport layer,
Electron-injection layer,
Aluminum as the cathode.

The emission layer can be a layer comprising organic polymers, organic oligomers, organic monomers, organic small non-polymeric molecules ("small molecules") or combinations thereof. In addition, a hole-transport layer and/or hole-injection layer can be present in the OLED, in order to enable effective hole injection and/or transport into at least one emission layer. Suitable materials for a hole-transport layer are, for example, tertiary amines, carbazole derivatives, polyaniline doped with casein sulfonic acid or polyethylene dioxythiophene doped with polystyrene sulfonic acid. Furthermore, additional layers can be present which are selected from hole-injection layers, hole-transport layers, electron-injection layers, electron-transport layers, hole-blocking layers and electron-blocking layers. Materials that are already known to the person skilled in the art can be selected as materials for these layers.

FIG. 12 shows the physical parameters of the organic electronic components produced. It is apparent that Cu(TFSI)$_2$ at all tested concentrations is particularly suitable as a p-type dopant and the doping effect is virtually independent of the concentration used. The external quantum efficiency (EQE) in percent % is, at all tested concentrations, surprisingly higher than that of an OLED with the commercial reference p-dopant NDP-9 of Novaled. The voltage U in V is also virtually identical up to a concentration of 10%. The doping effect is independent of the concentration in this region. Cu(TFSI)$_2$ has the same effectiveness as a p-dopant at all concentrations between 3% and 10%. In FIG. 12, the abbreviations R-D denote reference dopant, L luminance in cd/m2, $P_{eff}$ power efficiency in lm/W, $I_{eff}$ current efficiency in cd/m$^2$ and EQE external quantum efficiency in %.

Cu(TFSI)$_2$ can be used not only as a p-dopant in hole-transporting matrix materials, but also as a pure substance of the hole-injection layer. In other words, the hole injection layer consists of Cu(TFSI)$_2$. In this context "consist" means that the main constituent of the hole injection layer is Cu(TFSI)$_2$ and only impurities in the ppm range are present. In this case, the organic layer is not produced by co-doping the corresponding materials. Instead, Cu(TFSI)$_2$ with a concentration of almost 100% or exactly 100% without additives is applied. The application can be carried out in a wet-chemical manner or by evaporation in a vacuum.

Alternatively, however, other sulfonimide anions can also be used. Instead of TFSI as an anion, the metal cation, preferably Cu$^{2+}$, can also be combined with each aforementioned anion.

In particular, the anion can have the following structural formula.

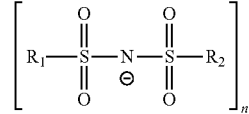

In this case, n indicates the significance. n can be between 1 and 7. Preferably, n=2. $R_1$ and $R_2$ can be selected independently of one another. $R_1$ and $R_2$ can be selected from the following group or combinations thereof: fluorine-substituted aryl radical, fluorine-substituted alkyl radical, fluorine-substituted arylalkyl radical.

The exemplary embodiments described in conjunction with the figures and the features thereof can also be combined with one another in accordance with further exemplary embodiments, even if such combinations are not explicitly shown in the figures. Furthermore, the exemplary embodiments described in conjunction with the figures can have additional or alternative features according to the description in the general part.

The invention is not restricted to the exemplary embodiments by the description on the basis of the exemplary embodiments. Rather, the invention encompasses any new feature and also any combination of features, which includes in particular any combination of features in the patent claims, even if this feature or this combination itself is not explicitly specified in the patent claims or exemplary embodiments.

The invention claimed is:

1. An organic electronic component comprising:
   at least one organic layer comprising a p-type dopant,
   wherein the p-type dopant consists of a fluorinated sulfonimide metal salt of the following formula:

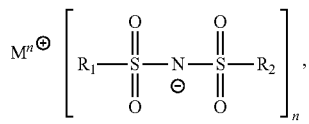

wherein M is either a divalent or higher-valent metal having an atomic mass of greater than 26 g/mol or a monovalent metal having an atomic mass of greater than or equal to 39 g/mol, wherein M is copper, zinc, aluminum, bismuth, potassium, rubidium, caesium or tin,
   wherein $1 \leq n \leq 7$,
   wherein $R_1$, $R_2$ are selected independently of one another from the group consisting of a fluorine-substituted aryl radical, a fluorine-substituted alkyl radical and a fluorine-substituted arylalkyl radical,
   wherein the organic layer is hole-transporting and comprises a matrix material, and
   wherein the p-type dopant acts as an electron acceptor in relation to the matrix material.

2. The organic electronic component according to claim 1, wherein M=copper and n=2.

3. The organic electronic component according to claim 1, wherein the matrix material is a hole-transport material.

4. The organic electronic component according to claim 1, wherein the p-type dopant has a proportion of between 1% by volume and 30% by volume in the matrix material.

5. The organic electronic component according to claim 1, wherein the matrix material is selected from the group consisting of HTM014, HTM081, HTM163, HTM222, NHT5, NHT49, NHT51, EL-301, EL-22T, HTM226, HTM355, HTM133, HTM334 and HTM604.

6. The organic electronic component according to claim 1, wherein $R_1$, $R_2$ are selected independently of one another from the group consisting of a linear or branched, at least partially fluorine-substituted alkyl radical having 1 to 10 carbon atoms, an at least partially fluorine-substituted aryl radical having 1 to 20 carbon atoms and an at least partially fluorine-substituted arylalkyl radical having 1 to 20 carbon atoms.

7. The organic electronic component according to claim 1, wherein $R_1$ and $R_2$ are the same substituents and are selected from the following group:

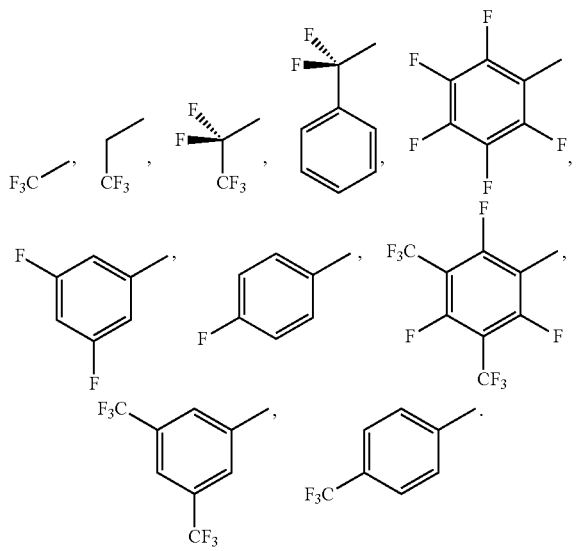

8. The organic electronic component according to claim 1, wherein the organic electronic component is an organic light-emitting diode.

9. The organic electronic component according to claim 1, wherein the organic electronic component is a solar cell.

10. The organic electronic component according to claim 1, wherein the organic layer is produced by co-deposition of the matrix material and the p-type dopant via physical vapour deposition.

11. The organic electronic component according to claim 1, wherein the organic layer is produced by a wet-chemical method.

12. The organic electronic component according to claim 1, wherein the organic layer is a charge carrier generation layer.

13. The organic electronic component according to claim 1, wherein the organic electronic component is a photodetector.

14. The organic electronic component according to claim 1, wherein the organic electronic component is an organic field-effect transistor.

15. An organic electronic component comprising:
    at least one organic layer comprising a p-type dopant,
    wherein the p-type dopant consists of a fluorinated sulfonimide metal salt of the following formula:

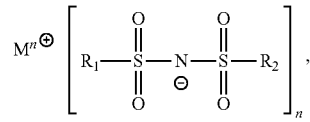

wherein M=copper and n=2, and
    wherein $R_1$, $R_2$ are selected independently of one another from the group consisting of a fluorine-substituted aryl radical, a fluorine-substituted alkyl radical and a fluorine-substituted arylalkyl radical.

16. The organic electronic component according to claim 15, wherein the organic layer is hole-transporting and comprises a matrix material, and wherein the p-type dopant acts as an electron acceptor in relation to the matrix material.

17. The organic electronic component according to claim 16, wherein the p-type dopant has a proportion of between 1% by volume and 30% by volume in the matrix material.

18. An organic electronic component comprising:
at least one organic layer,
wherein the organic layer is a hole-injection layer and consists essentially of a fluorinated sulfonimide metal salt of the following formula:

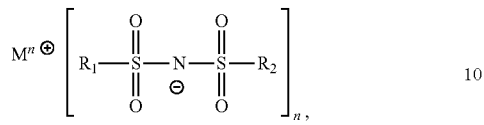

wherein $R_1$, $R_2$ are selected independently of one another from the group consisting of a fluorine-substituted aryl radical, a fluorine-substituted alkyl radical and a fluorine-substituted arylalkyl radical, and
wherein M=copper and n=2.

19. The organic electronic component according to claim 18, wherein $R_1$, $R_2$ are selected independently of one another from the group consisting of a linear or branched, at least partially fluorine-substituted alkyl radical having 1 to 10 carbon atoms, an at least partially fluorine-substituted aryl radical having 1 to 20 carbon atoms and an at least partially fluorine-substituted arylalkyl radical having 1 to 20 carbon atoms.

20. The organic electronic component according to claim 18, wherein the organic electronic component is an organic light-emitting diode.

* * * * *